United States Patent [19]

Encinas

[11] 3,961,340
[45] June 1, 1976

[54] INTEGRATED CIRCUIT HAVING BIPOLAR TRANSISTORS AND METHOD OF MANUFACTURING SAID CIRCUIT

[75] Inventor: Jean Encinas, Caen, France

[73] Assignee: U.S. Philips Corporation, New York, N.Y.

[22] Filed: Dec. 20, 1974

[21] Appl. No.: 535,144

Related U.S. Application Data

[63] Continuation of Ser. No. 308,034, Nov. 20, 1972, abandoned.

[30] Foreign Application Priority Data

Nov. 22, 1971 France .............................. 71.41734

[52] U.S. Cl. ................................... 357/40; 357/20; 357/34; 357/44; 357/48; 148/175
[51] Int. Cl.² ........................................ H01L 27/02
[58] Field of Search ................... 357/20, 34, 40, 44, 357/48

[56] References Cited
UNITED STATES PATENTS

| | | | |
|---|---|---|---|
| 3,566,218 | 2/1971 | Widlar et al. ......................... | 357/34 |
| 3,582,725 | 6/1971 | Matukura et al. ..................... | 357/34 |
| 3,596,115 | 7/1971 | Conzelmann et al. ................ | 357/44 |
| 3,607,465 | 9/1971 | Frouin ................................. | 357/48 |
| 3,723,200 | 3/1973 | Castrucci et al. ..................... | 357/44 |
| 3,725,145 | 4/1973 | Maki .................................... | 357/34 |
| 3,767,486 | 10/1973 | Imaizumi ............................. | 357/44 |
| 3,885,998 | 5/1975 | Reindl .................................. | 357/48 |

Primary Examiner—Andrew J. James
Assistant Examiner—Joseph E. Clawson, Jr.
Attorney, Agent, or Firm—Frank R. Trifari; Leon Nigohosian

[57] ABSTRACT

Method of producing integrated circuit including bipolar transistors, comprising the steps of forming collector zone of a first transistor at least partly by diffusing an impurity from a substrate part that is, before the growth of a first epitaxial layer on the substrate, doped at least locally with the impurity, forming the first epitaxial layer, and forming the collector zone of a second transistor by diffusing an impurity in the first epitaxial layer prior to growing a second epitaxial layer. Also, an integrated circuit produced by this method.

11 Claims, 11 Drawing Figures

INTEGRATED CIRCUIT HAVING BIPOLAR TRANSISTORS AND METHOD OF MANUFACTURING SAID CIRCUIT

This is a continuation of application Ser. No. 308,034, filed Nov. 20, 1972, now abandoned. The invention relates to a semiconductor device comprising a semiconductor body having a semiconductor substrate on which successively two epitaxial layers of a first conductivity type are provided and in which two bipolar transistors of the same polarity are provided in the semiconductor body.

In integrated circuit technology, low frequency power transistors are generally manufactured in individual semiconductor crystals due to the difficulty, which has not yet been overcome, of obtaining on the same crystal power transistors having a comparatively low transition frequency and transistors having an average or high transition frequency.

It is known that the transition frequency $f_T$ of a transistor is defined as the product of the current amplification at a given operating frequency of the transistor with said operating frequency (which actually defines a frequency bandwidth from the zero frequency). In practice, $f_T$ is substantially equal to the frequency $f_1$ at which the current amplification of the transistor is reduced to unity.

It is obvious that a power transistor which operates at low frequencies, for example, in the region of the audio frequencies (which transistor will hereinafter be simply referred to as LF power transistor) need not necessarily have a high transition frequency.

On the other hand it has been established in low frequency amplifiers that power transistors of high transition frequency may give rise to stray oscillations.

On the other hand, such transistors are subject to the defect known to those skilled in the art as "second breakdown" which is generally described as a sudden fall of the collector-emitter voltage of a transistor associated with the formation of conductivity paths in the transistor when same reaches a critical level of thermal dissipation and which results in destruction of the transistor.

On the contrary it is desirable for a transistor of average frequency or high frequency (which will hereinafter simply be referred to as HF transistor) that the transition frequency be as high as possible.

It is known that the transition frequency of a transistor varies substantially in inverse proportion to the square of the thickness of the base region.

A LF power transistor must thus have a relatively thicker base than a HF transistor irrespective of the power required of the latter.

For this reason it is difficult to design a manufacturing process of manufacturing a monolithic circuit with the two have denoted categories of transistors. The conventionally used technology involves that the base regions of the transistors of the same type have substantially the same thickness.

Since it is impossible to reach a satisfactory compromise between LF transistors and HF transistors, it has been preferred not to manufacture said different types of transistors in a common semiconductor body. In this manner suitable base thicknesses can be given to the transistors of each type.

One of the objects of the present invention is to provide HF transistors with high transition frequency and LF transistors with low transition frequency in a common semiconductor body.

The invention is based on the recognition of the fact that that the thickness of the base of an integrated transistor depends upon the average level at which the collector in the structure in question is present, all the rest being otherwise constant.

A semiconductor device of the type described in the preamble is therefore characterized according to the invention in that the transistors each comprise a collector zone of the opposite conductivity type in which the collector zone of one of the transistors, hereinafter referred to as first transistor, extends at the height of the level of the interface between the first epitaxial layer and the substrate, and the collector zone of the second transistor extends at the height of the level of the interface between the first epitaxial layer and the second epitaxial layer.

In this manner, the available layer heights between each of the two collectors and the outer active face of the assembly are significantly different and it is possible to give the base zones of both transistors each a suitable thickness.

In this manner it is possible to combine a LF power transistor with low transition frequency and a HF transistor with high transition frequency.

It is obvious that the manufacture of the transistor having a collector zone which is comparatively deep in the semiconductor body results in a LF power transistor, while the HF transistor is formed by a transistor the collector zone of which lies at the interface of the two epitaxial layers.

The thickness of the second epitaxial layer preferably is small and smaller than that of the first layer.

The small thickness of the second epitaxial layer meets the necessity to form the second transistor very close to the active face of the semiconductor body, from an island which is obtained by a diffusion carried out at the level of the interface of the two epitaxial layers, as will be described hereinafter.

The present invention also relates to a method of manufacturing a semiconductor device as described above.

According to the invention, a method of manufacturing an above-described semiconductor device is characterized in that the collector zone of the first transistor is obtained at least partly by diffusion of an impurity from a part of the substrate which is at least locally doped with said impurity prior to growing the first epitaxial layer and the collector zone of the second transistor is obtained by diffusion of at least a locally provided impurity in the first epitaxial layer prior to growing the second epitaxial layer.

This mode of operation has the important advantage that the gradient of the impurity concentration in the collector of the second transistor is negative in the direction from the collector to the surface of the semiconductor body. It is known that such a distribution of impurities facilitates a decrease of the saturation voltage of the transistors, while this also increases their resistance to breakdown.

In a preferred embodiment of a method according to the invention a prediffusion of the second conductivity type is carried out locally in a surface region of the semiconductor substrate of the first conductivity type, which prediffusion defines the location of the collector region of the first transistor (LF power transistor), succeeded by a second prediffusion likewise of the second conductivity type which is carried out at a band along the periphery of the surface region and which defines the location of the collector walls of the first transistor, the diffusion coefficient of the impurity of the second prediffusion being larger than the diffusion coefficient of the impurity of the first pre-diffusion.

The first epitaxial layer of the first conductivity type is then deposited and the diffusion of the impurities previously pre-diffused in the surface of the substrate is continued. During said diffusion, the said impurities penetrate into the interior of the first epitaxial layer and of the substrate, the level of penetration of the impurities being highest at the periphery of the surface region of the substrate.

A pre-diffusion of the second conductivity type which defines the location of the second transistor (HF transistor) is then carried out at the surface of the first epitaxial layer, beyond the zone corresponding to the preceding diffusion, and over a restricted surface area.

The second epitaxial layer of the first conductivity type is then deposited, at the surface of which a pre-diffusion of the second conductivity type is carried out, on the one hand in the direction of the central part of the collector region of the first transistor, on the other hand in the direction of the band over the width of a wreath which is of substantially the same shape as said band.

On the one hand a zone can be created which extends up to the surface of the second epitaxial layer and the bottom of which constitutes the collector region of the second transistor, on the other hand an emitter region an the collector walls of the first transistor can be created, the base region of said first transistor being constituted by the part of the epitaxial layer which is enclosed between the collector walls and the emitter region, the collector walls being constituted in that impurities from the wreath and impurities which are previously diffused in the band diffuse towards each other via the epitaxial layer.

From the surface of the second epitaxial layer, a diffusion in the said zone is then carried out of the first conductivity type so as to form the base region of the second transistor.

Finally, a diffusion of the second conductivity type is simultaneously carried out in a part of the base region of the second transistor so as to form the emitter region of the second transistor and on the interfaces of the emitter region and the collector walls of the first transistor.

According to this method, the manufacture of both transistors in a common semiconductor body has proved possible.

The thickness of the base region of the LF power transistor depends upon the thickness of the first epitaxial layer and upon the depth of diffusion of the emitter region of the LF power transistor. By modulating these two factors, the thickness of the base region may be varied several microns and thus adjust the desired properties of the transistors, in particular as regards the transition frequency.

It is to be noted that, because the second transistor is processed from the surface of the first epitaxial layer, the thickness of this first layer has substantially no influence on the properties of the second transistor, of which, in particular, the transition frequency can be obtained to be as high as that of HF transistors which are manufactured on individual semiconductor crystals according to the conventional methods.

It is obvious that the monolithic assembly according to the invention may comprise further active or passive elements.

In particular, the base structure which is constituted by at least one LF power transistor and at least one HF transistor which are combined on the same semiconductor crystal may be completed by at least one further LF power transistor which is complementary to the first LF power transistor.

Said further LF power transistor, whose conductivity type is opposite to that of the first transistor comprises a collector region which is formed in a part of the epitaxial layer which is isolated from the remainder of the layer by an isolation zone surrounding it (hereinafter termed peripheral isolation zone), base and emitter regions formed by diffusions carried out respectively from the surface of the first and the second epitaxial layers.

The isolation zone of the transistor is obtained simultaneously and in the same manner as the collector region and the collector walls of the first LF power transistor. The base region hereof is formed during the same operation by the same process as the collector region of the HF transistor. The emitter region hereof is formed simultaneously and in the same manner as the base region of the HF transistor.

So the manufacture of said further LF power transistor occurs without extra operation in the common manufacturing cycle of the first LF power transistor and of the HF transistor. By suitable control of the diffusion of the base region it is possible to give the base a thickness which is sufficient to bring the transition frequency at the desired value.

In this manner a complementary assembly of two LF power transistors with low transition frequencies can thus be obtained which enable the construction of an audio frequency amplifier with the HF transistor or HF transistors manufactured on the same crystal.

It is possible that the characteristic properties and especially the current amplification of each of the said LF power transistors show a small difference, but the negative feedback factor used in this type of amplifiers results in a re-grouping of the said properties, which ensures a satisfactory result.

The invention will be described in greater detail with reference to a few embodiments and the accompanying diagrammatic drawing, in which:

FIGS. 1a to 1h are sectional views taken on the line I—I of FIG. 2 of a monolithic assembly according to the invention in various phases of the manufacture, and of which

FIG. 3 is a diagrammatic sectional view taken on the line III—III of FIG. 4 of a further semiconductor device according to the invention, of which

Figure 1A:
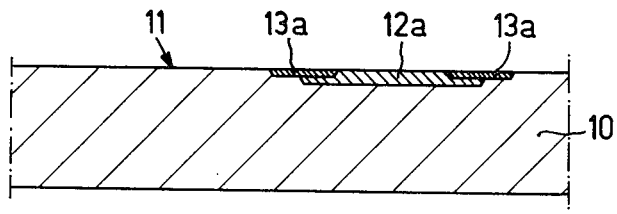
Figure 1B:
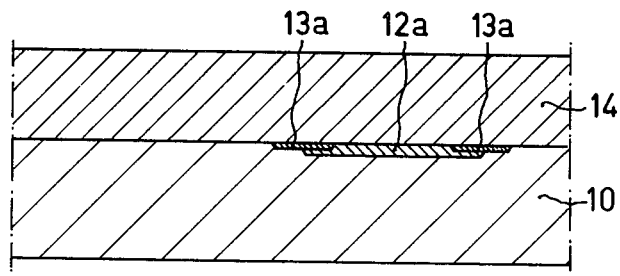

It is to be noted that the dimensions in the drawings are considerably exaggerated and that for clarity the proportions are not observed, in particular in the direction of the thickness.

The oxide layers which may be formed during various thermal treatments are not shown either. In the course of the description there are mentioned protective layers, the formation of such layers and their use as masks being known.

The deposition operations or pre-diffusions of impurities which it is desired to diffuse will not always be mentioned because, subject to statements to the contrary, the diffusions are usually preceded by a pre-diffusion deposit.

FIGS. 1a to 1h show the manufacture of n-p-n transistors but it is obvious that in the same manner p-n-p transistors could be manufactured by inverting all the conductivity types mentioned in this description.

For the sake of simplicity, the first LF power transistor will hereinafter be referred to as "transistor $T_1$", the HF transistor as "transistor $T_2$", in which the transistors $T_1$ and $T_2$ are of the same type, and the second LF power transistor of the type which is opposite to the first transistor $T_1$ as "transistor $T_3$".

Starting material in the embodiment shown in FIGS. 1a to 1h is a substrate which is constituted by a p-type monocrystalline plate 10 (FIG. 1a). A first pre-diffusion with a first impurity is carried out on the surface 11 which has been prepared in the correct manner so as to obtain the surface region 12 the conductivity type of which is opposite to that of the plate 10, that is to say in the present example of the n-type. The pre-diffused surface region 12a has such a pattern and such a surface that after diffusion it can form the collector region of transistor $T_1$.

A second pre-diffusion is then carried out with a second impurity of the n-type in the width of a band 13a which is present along the periphery of the region 12a. The collector wall of transistor $T_1$ must be formed partly from the band 13a. In regard to this, the second impurity shows a greater diffusion coefficient that the first impurity.

The p-type epitaxial layer 14 (FIG. 1b) is provided on the surface 11 of the substrate 10 including the regions 12a and 13a, of which layer 14 the resistivity shows a suitable value in connection with the base region of the transistor $T_1$. During the deposition, the impurities provided in 12a and 13a begin to diffuse, on the one hand, in the epitaxial layer 14, and on the other hand, inwardly into the substrate 10 and thus constitute the collector region 12 and a part 13 of the collector walls of the transistor $T_1$.

Figure 1C:
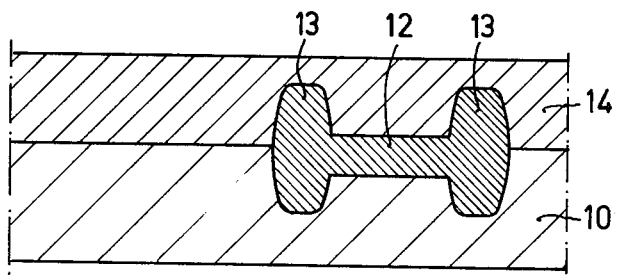

After providing the epitaxial layer 14, a complementary diffusion treatment is carried out which will be continued during the subsequent operations for the manufacture of the monolithic assembly (FIG. 1c).

Figure 1D:
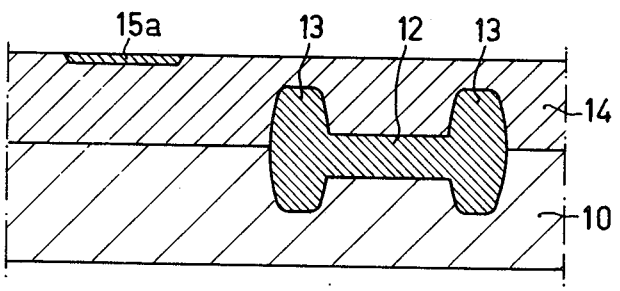

An n-type pre-diffusion 15a of the same n-conductivity type as the deposits 12a and 13a is then carried out on the outer surface of the epitaxial layer 14 and beyond the location corresponding to transistor $T_1$ so as to obtain the n-type zone in which the transistor $T_2$ will afterwards be manufactured (FIG. 1d).

The next step is the formation of a second p-type epitaxial layer 16 of the same conductivity type as the layer 14 but having a smaller thickness than the layer 14.

Figure 1E:
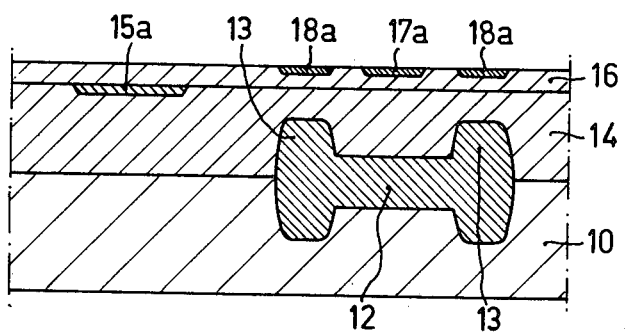

The n-type pre-diffusion regions 17a and 18a are then provided simultaneously on the surface of the layer 16, the former, 17a, above the central part of the collector region 12 of transistor $T_1$, the latter, 18a, over the width of a wreath which is substantially of the same shape as the band 13a and is present above the latter (see FIG. 1e). The impurities provided in the regions 15a, 17a and 18a are diffused further inwardly after which the structure shown in FIG. 1f is obtained.

Transistor $T_1$ is now fully formed: as a result of the diffusion of the impurity provided in the region, the emitter region 17 of said transistor has been formed; the collector walls (13, 18) of the said transistor have been formed from the regions 13a and 18a which have formed a single coherent diffused region. The base region of said transistor is constituted by the part 19 the epitaxial layers (14, 16) which is enclosed between the collector walls (13, 18) and the collector portion 12.

Figure 1F:
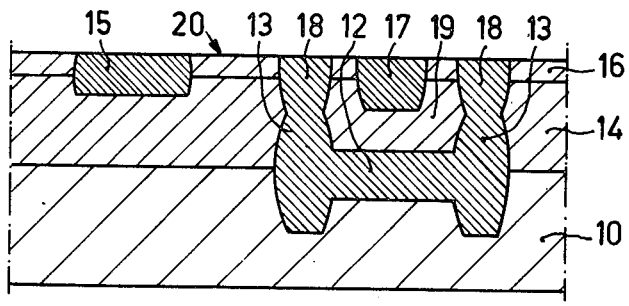
Figure 1G:
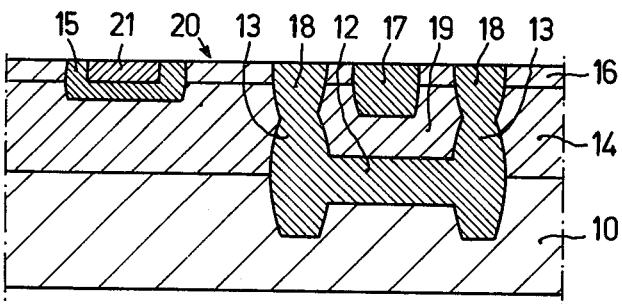

As shown in FIG. 1f, a zone 15 is formed which extends to the surface 20, in which zone the manufacture of transistor $T_2$ will be continued. For that purpose, a p-type impurity is diffused in a part of the island 15 from the surface 20, as a result of which the base region 21 of the transistor $T_2$ is obtained (see FIG. 1g).

The diffusion of an impurity of the n-conductivity type is finally carried out inside the base region 21 so as to form an emitter region 22 of the transistor $T_2$. Simultaneously with the formation of the emitter region, a diffusion of the n-conductivity type is carried out with a high concentration so as to form the collector contact zone 23 and the emitter contact zone 24 of transistor $T_1$.

Figure 1H:
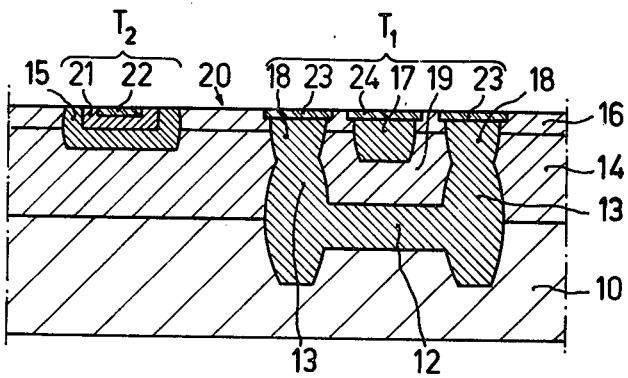

FIG. 1h shows diagrammatically the structure which is obtained after said diffusion treatment.

It appears that the collectors of the transistors $T_1$ and $T_2$ are located at significantly different levels. The difference in level actually is associated with the thickness of the first epitaxial layer 14. It is obvious that it is thus possible to bring the thickness of the base of transistor $T_1$ at a significantly higher value than that of the base of the transistor $T_2$ and thus to ensure that the two transistors have very significantly different transition frequencies.

It is to be noted that, as already stated in the preamble and as will appear from the Figures, the concentration of impurities in the collector of transistor $T_2$ decreases in the direction of the collector surface 20 of the semiconductor device.

Figure 2:
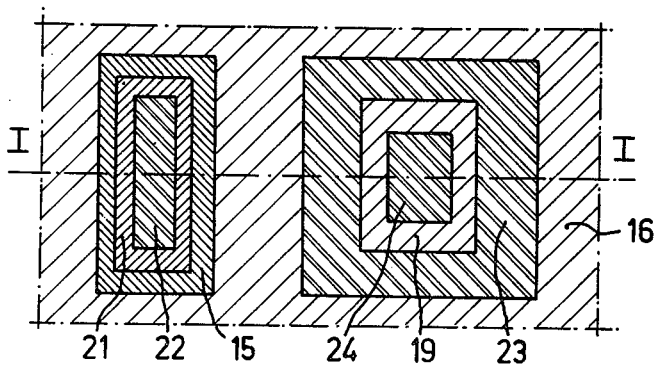
FIG. 2 is a diagrammatic plan view.

FIG. 2 shows an example of a possible configuration of a monolithic semiconductor device whose manufacturing method has just been described and which is shown in FIG. 1h. FIG. 2 shows boundary surfaces 24 of the emitter 17, the base region 19, the boundary surface 23 of the collector wall (13, 18) of transistor $T_1$ and that of the emitter region 22, of the base region 21 and the collector region 15 of the transistor $T_2$.

Figure 3:
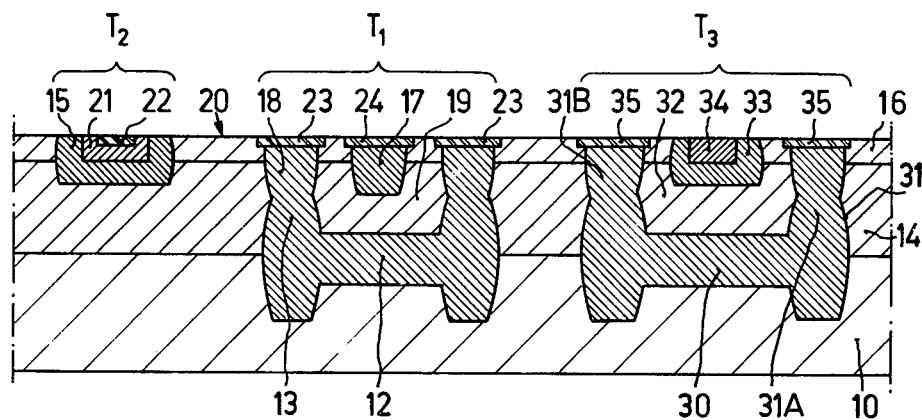

FIG. 3 is a diagrammatic sectional view of a further embodiment of a semiconductor device according to the invention comprising two transistors $T_1$ and $T_2$ as described in the preceding embodiment and a third LF power transistor $T_3$ which is complementary to transistor $T_1$, the assembly being again manufactured on a common crystal.

It is to be noted that the same reference numerals are used for corresponding components as in the preceding embodiment.

Transistor $T_3$, in the present case a p-n-p transistor, while transistors $T_1$ and $T_2$ are of the n-p-n type as in the preceding embodiment, is isolated by an isolation zone which comprises a bottom 30 and upright walls 31. The collector region of $T_3$ is constituted by a part 32 of the epitaxial layer in which the base region 33 is provided which surrounds the emitter region 34 in the semiconductor body.

The manufacture of transistor $T_3$ is carried out simultaneously with that of the two other transistors.

The bottom 30 of the isolation zone and the lower part 31A of the isolation walls 31 are thus formed by diffusion of two different impurities of the n-type with different diffusion coefficients as this is done for the collector region 12 and the part 13 of the collector walls of transistor $T_1$.

The upper part 31B of the insulation walls is obtained simultaneously with the upper part 18 of the collector walls of transistor $T_1$. During this operation an n-type zone is formed within the part of the epitaxial layer which is enclosed by the walls 31 and which is present above the central part of the bottom part 30 in a manner analogous to the zone 15 of FIG. 1f so as to obtain the base region 33 of transistor $T_3$.

The emitter region 34 of transistor $T_3$ can be obtained by diffusion of a p-type impurity simultaneously with the formation of the base region 21 of transistor $T_2$.

The completion of transistor $T_3$ is finally enabled by an n-type diffusion which is carried out simultaneously in the surface regions 35 of the isolation zone 31 and in surface regions of the collector walls (13, 18) and of the emitter 17 of transistor $T_2$.

Figure 4:
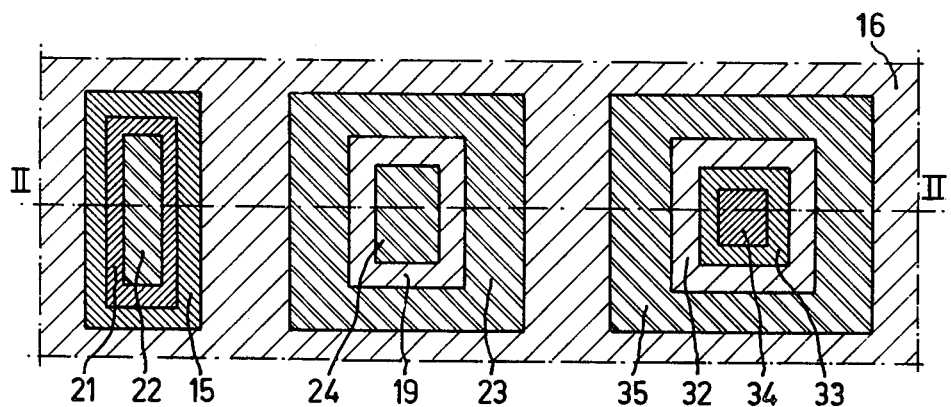
FIG. 4 is a diagrammatic plan view.

The semiconductor device which is shown in a cross-section in FIG. 3 is shown in a plan view in FIG. 4. This Figure shows, in addition to the elements of transistors $T_1$ and $T_2$, the surface regions 35 of the insulation walls 31 and the surface regions of the collector region 32, the base region 33 and of the emitter region 34 of transistor $T_3$.

By way of example are stated hereinafter the nature of the materials used and the characteristic values of the dimensions, concentration of impurities or resistivity of the various layers for manufacturing a monolithic semiconductor device according to the invention which comprises transistors, as $T_1$, $T_2$ of the n-p-n type and $T_3$ of the p-n-p type.

Starting material is a monocrystalline p-type silicon plate 10, thickness approximately 150 micron, resistively in the order of 5 to 40 ohm cm.

The resistivity of the two epitaxial layers 14 and 16 which are of the p-type lies between 0.5 and 5 ohm cm.

Arsenic is diffused to form the collector region 12 of transistor $T_1$ and of the bottom 30 of the insulation zone of transistor $T_3$. The surface concentration of the pre-diffused regions which introduce the formation of said parts of the assembly lies in the order of $10^{19}$ atoms per cm$^3$.

The collector walls 13, 18, the emitter region 17 of transistor $T_1$ and the insulation walls 31 of transistor $T_3$ are preferably obtained by the difffusion of phosphorus in a surface concentration of $5 \times 10^{20}$ to $10^{21}$ atoms per cm$^3$.

Aresnic diffusions in a surface concentration in the order of $10^{19}$ atoms per cm$^3$ are carried out to manufacture the zone 15 of transistor $T_2$ and the zone in which the base region 33 and the emitter regions 34 of transistor $T_3$ are realized which zones are of the n-type.

The base region 21 of transistor $T_2$ and the emitter region 34 of transistor $T_3$ which are of the p-type are preferably obtained by diffusions of boron in a surface concentration of $10^{18}$ to $5 \times 10^{18}$ atoms per cm$^3$.

A diffusion of phosphorus in an initial surface concentration of $10^{20}$ to $10^{21}$ atoms per cm$^3$ enables the formation of the emitter region 22 of transistor $T_2$ and simultaneously the amplification of the conductivity of the collector contact zones 23 and the emitter contact zones 24 of transistor $T_1$ as well as that of contact zone 35 of the insulation walls of transistor $T_3$.

As regards to dimensions, the epitaxial layer 14 is preferably given a thickness of 18 micron (16–20), while the thickness of the epitaxial layer 16 is only 3 micron (2.5 to 4). The thickness of the base region of the transistor $T_1$ between the diffusion front of the emitter region 17 and the collector region 12 of transistor $T_1$ is 10 to 15 micron.

The thickness of the base region 21 of transistor $T_2$ is 0.5 to 1.5 micron and that of the base region 33 of the transistor $T_3$ is 3 to 4 micron.

I claim:

1. A semiconductor device containing at least two bipolar transistors of the same polarity and comprising a semiconductor body, said body comprising
   a. a semiconductor substrate comprising at least a surface portion of a first conductivity type;
   b. first and second epitaxial layers of said first conductivity type successively disposed on said substrate, said first layer being located between said substrate and said second layer; and
   c. said bipolar transistors individually comprising emitter, base, and collector zones, said collector zones being of a second opposite conductivity type, at least a part of said second conductivity type collector zone of a first one of said transistors being disposed at said surface portion and extending along a first interface between said substrate and said first epitaxial layer, at least a part of said collector zone of a second one of said transistors extending along a second interface located between said first and second layers and being at least partly located above said first transistor collector zone, said collector of said first transistor at least partially defining a base region that is located in said first and second epitaxial layers and that has a thickness exceeding the base region of said second transistor, said second transistor base region being located only in said second epitaxial layer.

2. A semiconductor device as recited in claim 1, wherein the thickness of said first epitaxial layer exceeds that of said second epitaxial layer.

3. A semiconductor device as recited in claim 1, wherein said substrate is completely of said first conductivity type.

4. A semiconductor device as recited in claim 1, wherein the impurity concentrations of said epitaxial layers are substantially equal.

5. A semiconductor device as recited in claim 1, wherein said part of said first transistor collector zone comprises the bottom portion of said collector zone and said collector zone of said first transistor further comprises a collector wall portion which surrounds said base zone of said first transistor and extends from said bottom portion through said epitaxial layers up to the surface of said semiconductor body.

6. A semiconductor device as recited in claim 1, whereby said body further comprises at least a third transistor complementary to said first and second transistors.

7. A semiconductor device as recited in claim 6, wherein said third transistor comprises a collector zone formed by respective portions of said epitaxial layers.

8. A semiconductor device as recited in claim 6, wherein said body further comprises a cup-shaped isolation zone of said first conductivity type and said third transistor comprises an island-shaped part of said epitaxial layers, said island-shaped part being defined by and separated from surrounding part of said semiconductor body by said cup-shaped isolation zone.

9. A semiconductor device as recited in claim 6, wherein said first and second transistors are of the n, p, n type and said third transistor is of the p, n, p type.

10. A semiconductor device as recited in claim 1, wherein said semiconductor body comprises silicon.

11. A semiconductor device as recited in claim 1, wherein said epitaxial layers are of p-type conductivity and individually have a resistivity which lies between 0.5 and 5 ohm-cm.

* * * * *